(12) United States Patent
Traut et al.

(10) Patent No.: US 10,385,217 B2
(45) Date of Patent: *Aug. 20, 2019

(54) FORMULATIONS COMPRISING HYDRIDOSILANES AND HYDRIDOSILANE OLIGOMERS, THEIR PROCESS OF MANUFACTURE AND THEIR USE

(71) Applicant: Evonik Degussa GmbH, Essen (DE)

(72) Inventors: Stephan Traut, Loerrach Bromba (DE); Matthias Patz, Bottrop (DE); Stephan Wieber, Karlsruhe (DE); Paul Henrich Wöbkenberg, Hoelingen (DE); Joachim Erz, Schwoerstadt (DE); Jutta Hessing, Dorsten (DE)

(73) Assignee: Evonik Degussa GmbH, Essen (DE)

( * ) Notice: Subject to any disclaimer, the term of this patent is extended or adjusted under 35 U.S.C. 154(b) by 409 days.

This patent is subject to a terminal disclaimer.

(21) Appl. No.: 14/899,401

(22) PCT Filed: Jun. 12, 2014

(86) PCT No.: PCT/EP2014/062229
§ 371 (c)(1),
(2) Date: Dec. 17, 2015

(87) PCT Pub. No.: WO2014/202453
PCT Pub. Date: Dec. 24, 2014

(65) Prior Publication Data
US 2016/0145440 A1   May 26, 2016

(30) Foreign Application Priority Data

Jun. 18, 2013  (DE) .................. 10 2013 010 101

(51) Int. Cl.
*C09D 1/00* (2006.01)
*C23C 18/12* (2006.01)
(Continued)

(52) U.S. Cl.
CPC .............. *C09D 1/00* (2013.01); *C09D 183/16* (2013.01); *C23C 18/122* (2013.01);
(Continued)

(58) Field of Classification Search
CPC ...... C09D 1/00; C09D 183/04; C09D 183/16; C23C 18/1212; C23C 18/122;
(Continued)

(56) References Cited

U.S. PATENT DOCUMENTS 6,027,705 A    2/2000  Kitsuno et al.
2012/0214005 A1*  8/2012  Wieber ................. C01B 33/04
                                                          428/447
(Continued)

FOREIGN PATENT DOCUMENTS

DE         2 139 155         2/1973
WO    WO 2012/041837 A2    4/2012
WO    WO 2012/041837 A3    4/2012

OTHER PUBLICATIONS

International Search Report dated Jul. 8, 2014 in PCT/EP2014/062229 (with English language translation).

*Primary Examiner* — Melvin C. Mayes
*Assistant Examiner* — Smita S Patel
(74) *Attorney, Agent, or Firm* — Grüneberg and Myers PLLC

(57) ABSTRACT

The present invention relates to formulations comprising at least one hydridosilane of the generic formula $Si_nH_{2n+2}$ with n=7-10 and at least one hydridosilane oligomer, to processes for preparation thereof and to the use thereof.

19 Claims, 4 Drawing Sheets

(51) Int. Cl.
  *H01L 31/18* (2006.01)
  *C09D 183/16* (2006.01)
  *C08G 77/60* (2006.01)
  *C08G 77/04* (2006.01)

(52) U.S. Cl.
  CPC ...... C23C 18/1212 (2013.01); H01L 31/1804 (2013.01); H01L 31/1864 (2013.01); *C08G 77/045* (2013.01); *C08G 77/60* (2013.01); *Y02E 10/547* (2013.01); *Y02P 70/521* (2015.11)

(58) Field of Classification Search
  CPC ... C08G 77/60; C08G 77/045; H01L 31/1804; H01L 31/1864; C08L 83/00
  See application file for complete search history.

(56) References Cited

U.S. PATENT DOCUMENTS

2012/0291665 A1* 11/2012 Wieber ............... C08G 77/60 106/287.1
2013/0183223 A1 7/2013 Wieber et al.

* cited by examiner

FORMULATIONS COMPRISING HYDRIDOSILANES AND HYDRIDOSILANE OLIGOMERS, THEIR PROCESS OF MANUFACTURE AND THEIR USE

BACKGROUND OF THE INVENTION

Field of the Invention

The present invention relates to formulations comprising at least one low molecular weight hydridosilane and at least one hydridosilane oligomer, to processes for preparation thereof and to the use thereof, especially for production of silicon-containing layers.

Hydridosilanes or oligomers thereof have been described in the literature as possible reactants for the production of silicon-containing layers.

Discussion of the Background

Hydridosilanes are understood to mean compounds containing essentially only silicon and hydrogen atoms and having fewer than 20 silicon atoms. Hydridosilanes may in principle be gaseous, liquid or solid and are—especially in the case of solids—essentially soluble in solvents such as toluene or cyclohexane or in liquid silanes such as cyclopentasilane. Examples include monosilane, disilane, trisilane, cyclopentasilane and neopentasilane. Hydridosilanes having at least three or four silicon atoms may have a linear, branched or cyclic (optionally bi-/polycyclic) structure having Si—H bonds, and can preferably be described by the respective generic formulae $Si_nH_{2n+2}$ (linear or branched; with n=2-20), $Si_nH_{2n}$ (cyclic; with n=3-20) or $Si_nH_{2(n-i)}$ (bi- or polycyclic; n=4-20; i={number of cycles}−1).

Processes for preparing hydridosilanes having at least 3 silicon atoms are disclosed, for example, in U.S. Pat. No. 6,027,705 A. A thermal process for preparing oligomers of hydridosilanes is disclosed by WO 2011/104147 A1. In addition, WO 2012/041837 A2 discloses a process for preparing higher hydridosilane compounds, in which a lower hydridosilane compound is converted thermally in the presence of a hydridosilane polymer of at least 500 g/mol.

Silicon-containing layers can be deposited from the gas phase in vacuum chambers, for example via PECVD. Gas phase processes, however, are technically complex and often do not lead to layers of the desired quality. For this reason, liquid phase processes are often preferred for production of silicon-containing layers.

The prior art describes various hydridosilane-containing formulations. For example, U.S. Pat. No. 5,866,471 A discloses formulations containing semiconductor precursors, with which semiconductor layers can be produced. The usable semiconductor precursors also include hydridosilanes. WO 2008/137811 A2 also discloses compositions containing one or more semiconductor precursors which are selected from a group and include (poly)silanes. US 2009/0215219 A1 also discloses a process for producing a semiconductor layer, in which a liquid coating composition containing silicon atoms is applied to a substrate. The coating composition may contain a silane polymer, which may be a polyhydridosilane. US 2010/0197102 A1 discloses solutions containing a compound which is preferably a silane having four to nine silicon atoms. Coating compositions containing a polysilane are also described in EP 1 357 154 A1. EP 1 640 342 A1 further discloses silane polymers having a weight-average molecular weight of 800 to 5000 g/mol, which can be used for production of silicon-containing films. JP 2008-270603 A and JP 09-45922 A also disclose coating compositions for production of silicon-containing films, in which various silicon compounds can be used as precursors. Mixtures of various hydridosilane precursors are not disclosed in the literature references cited.

JP 2004-134440 A discloses coating compositions for production of silicon-containing films, which contain various silane compounds and cyclic silanes. EP 1 085 579 A1 and EP 1 087 428 A1 also disclose coating compositions for production of silicon-containing layers, in which two silicon precursors are used. These are a cyclic silicon compound and a doped silicon compound. JP 2000-031066 A discloses liquid coating compositions containing a hydridosilane of the generic formula $Si_nH_{2n+2}$ or $Si_nH_{2n}$ or mixtures of the two. DE 10 2010 030 696 A1 likewise discloses liquid coating compositions which may include hydridosilanes as silicon precursors.

Coating compositions containing exclusively low molecular weight hydridosilanes as silicon precursor have disadvantages in the production of silicon-containing layers. More particularly, they are unsuitable for the production of very thin silicon-containing layers (layers having a thickness of max. 25 nm), since the low molecular weight material vaporizes before it can crosslink at typical conversion temperatures. For this reason, coating compositions containing hydridosilane oligomers having high molecular weights are often used. These high molecular weight hydridosilane oligomers are suitable in principle for production of silicon-containing layers, but they have the disadvantage of dissolving only sparingly in organic solvents, which leads to disadvantages of the layers produced therewith. For this reason, there exist, in the prior art, coating compositions including not only high molecular weight hydridosilane oligomers but also low molecular weight hydridosilanes, the latter functioning as solubilizers.

The prior art discloses coating compositions for production of silicon-containing layers, containing a hydridosilane oligomer in a mixture with a cyclic hydridosilane (Masuda et al., Thin Solid Films 520 (2012) 5091-5096). Corresponding coating compositions containing a cyclic hydridosilane, however, have the disadvantage that they are stable only at high concentrations of cyclic hydridosilanes. At low concentrations of cyclic hydridosilanes, the formulations rapidly become cloudy and are then unsuitable for production of high-quality silicon-containing layers.

SUMMARY OF THE INVENTION

It has also been found that lower hydridosilanes having 3 to 6 silicon atoms, especially those of the formula $Si_nH_{2n+2}$, in formulations comprising hydridosilane oligomers, have the disadvantage of not being incorporated into the layer structure in the course of conversion. Thus, the yield, based on all the silicon-containing precursors, in the case of use of corresponding coating compositions, is unfavourable.

The problem addressed by the present invention is therefore that of providing coating compositions which are suitable for the production of silicon-containing layers and overcome the disadvantages of the prior art. More particularly, the problem addressed by the present invention is that of providing stable coating compositions which, aside from the hydridosilane oligomer, require further components only in small proportions. In addition, the further component is also to be incorporated into the layer structure with good yields.

The present problem is solved in the present context by the inventive formulation comprising at least one hydridosilane and at least one hydridosilane oligomer, in which the hydridosilane has the generic formula $Si_nH_{2n+2}$ with n=7 to 10. Corresponding formulations do not just solve the problems addressed by the invention, but are also especially suitable for production of high-quality, thick layers of thickness at least 25 nm, especially having thicknesses of 50-1000 nm, from the liquid phase, and have good wetting of substrates commonly used in the coating process.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE INVENTION

Figure 1:
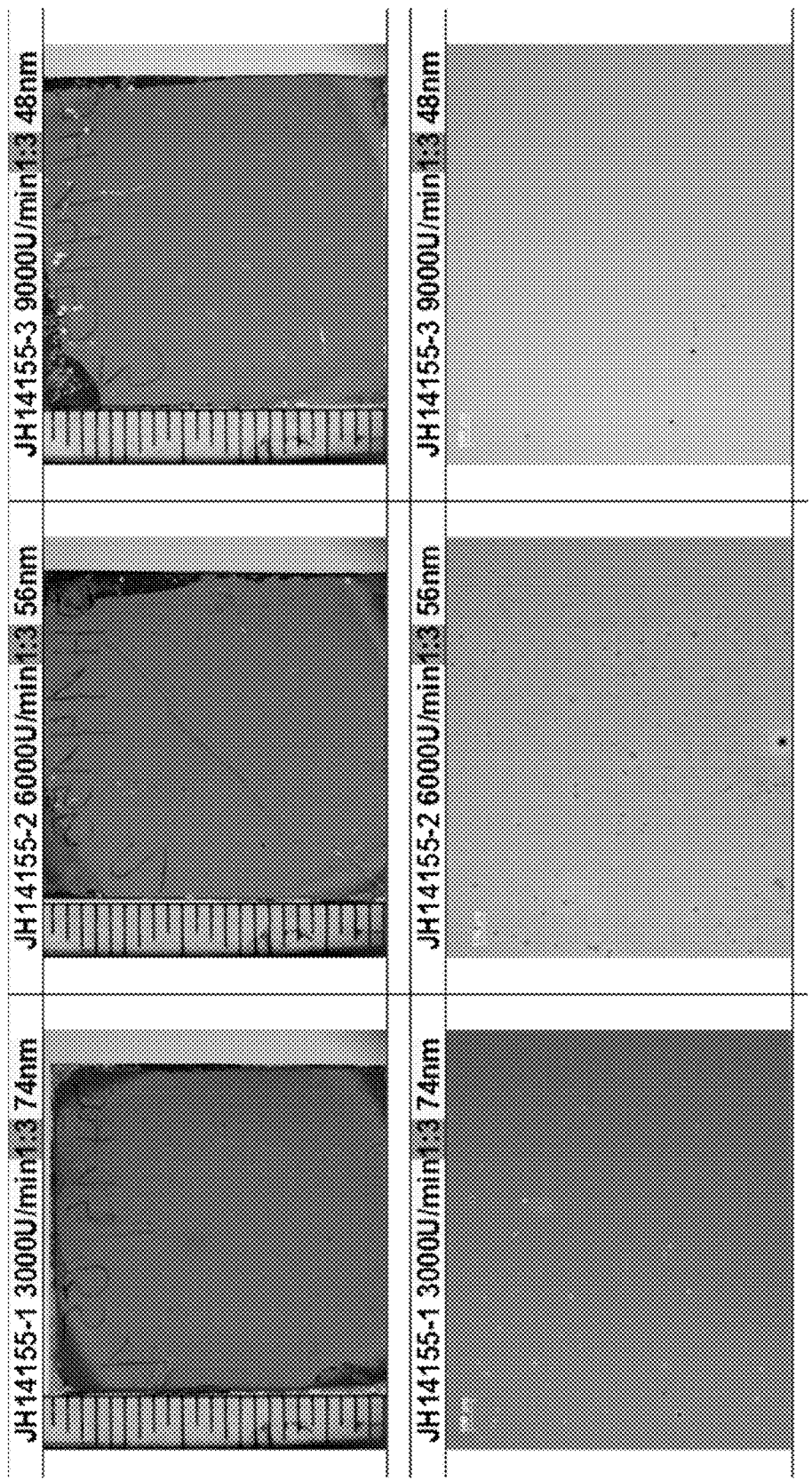
FIG. 1 are photographs and microscope images of a coating formed in Example 1.

The formulation claimed in the present context is a composition comprising at least one hydridosilane and at least one hydridosilane oligomer, or consisting of a mixture of the two. The formulation is preferably liquid, since it can thus be handled in a particularly efficient manner. It is additionally preferable that the inventive formulation is a coating composition, especially for liquid phase or CVD deposition processes. Corresponding coating compositions have the advantage of being suitable for the deposition of silicon-containing layers, especially for the processes mentioned. The inventive composition is most preferably a coating composition suitable for liquid phase deposition processes.

Hydridosilanes of the formula $Si_nH_{2n+2}$ with n=7 to 10 are noncyclic hydridosilanes. The isomers of these compounds may be linear or branched. Preferred noncyclic hydridosilanes are octasilane (i.e. n-octasilane, 2-silylheptasilane, 3-silylheptasilane, 4-silylheptasilane, 2,2-disilylhexasilane, 2,3-disilylhexasilane, 2,4-disilylhexasilane, 2,5-disilylhexasilane, 3,4-disilylhexasilane, 2,2,3-trisilylpentasilane, 2,3,4-trisilylpentasilane, 2,3,3-trisilylpentasilane, 2,2,4-trisilylpentasilane, 2,2,3,3-tetrasilyltetrasilane, 3-disilylhexasilane, 2-silyl-3-disilylpentasilane and 3-silyl-3-disilylpentasilane) and nonasilane (i.e. n-nonasilane, 2-silyloctasilane, 3-silyloctasilane, 4-silyloctasilane, 2,2-disilylheptasilane, 2,3-disilylheptasilane, 2,4-disilylheptasilane, 2,5-disilylheptasilane, 2,6-disilylheptasilane, 3,3-disilylheptasilane, 3,4-disilylheptasilane, 3,5-disilylheptasilane, 4,4-disilylheptasilane, 3-disilylheptasilane, 4-disilylheptasilane, 2,2,3-trisilylhexasilane, 2,2,4-trisilylhexasilane, 2,2,5-trisilylhexasilane, 2,3,3-trisilylhexasilane, 2,3,4-trisilylhexasilane, 2,3,5-trisilylhexasilane, 3,3,4-trisilylhexasilane, 3,3,5-trisilylhexasilane, 3-disilyl-2-silylhexasilane, 4-disilyl-2-silylhexasilane, 3-disilyl-3-silylhexasilane, 4-disilyl-3-silylhexasilane, 2,2,3,3-tetrasilylpentasilane, 2,2,3,4-tetrasilylpentasilane, 2,2,4,4-tetrasilylpentasilane, 2,3,3,4-tetrasilylpentasilane, 3-disilyl-2,2-disilylpentasilane, 3-disilyl-2,3-disilylpentasilane, 3-disilyl-2,4-disilylpentasilane and 3,3-disilylpentasilane), formulations of which lead to particularly good results. Likewise preferably, the hydridosilane of said generic formula is a branched hydridosilane which leads to more stable solutions and better layers than a linear hydridosilane. Most preferably, the hydridosilane is a mixture of nonasilane isomers, which can be prepared via thermal treatment of neopentasilane or by a method described by Holthausen et al. (poster presentation: A. Nadj, 6th European Silicon Days, 2012). The best results can be achieved with corresponding formulations.

The hydridosilane oligomer is the oligomer of a hydridosilane compound, and preferably the oligomer of a hydridosilane. The inventive formulation is of particularly good suitability for the production of silicon-containing layers when the hydridosilane oligomer has a weight-average molecular weight of 200 to 10 000 g/mol. Processes for preparation thereof are known to those skilled in the art. Corresponding molecular weights can be determined via gel permeation chromatography using a linear polystyrene column with cyclooctane as eluent against polybutadiene as reference.

The hydridosilane oligomer is preferably obtained by oligomerization of noncyclic hydridosilanes. Unlike hydridosilane oligomers formed from cyclic hydridosilanes, these oligomers have a high crosslinking level because of the different way in which the dissociative polymerization mechanism proceeds. Instead, because of the ring-opening reaction mechanism to which cyclic hydridosilanes are subject, oligomers formed from cyclic hydridosilanes have only a very low crosslinking level, if any. Corresponding oligomers prepared from noncyclic hydridosilanes, unlike oligomers formed from cyclic hydridosilanes, give good wetting of the substrate surface in solution, can be used particularly efficiently for production of thin layers and lead to homogeneous and smooth surfaces. Even better results are exhibited by oligomers formed from noncyclic, branched hydridosilanes.

A particularly preferred hydridosilane oligomer is an oligomer obtainable by thermal conversion of a composition comprising at least one noncyclic hydridosilane having not more than 20 silicon atoms in the absence of a catalyst at temperatures of <235° C. Corresponding hydridosilane oligomers and the preparation thereof are described in WO 2011/104147 A1 which is incorporated by reference in relation to the compounds and the preparation thereof. This oligomer has even better properties than the further hydridosilane oligomers formed from noncyclic, branched hydridosilanes.

The hydridosilane oligomer may also have other residues aside from hydrogen and silicon. Thus, advantages of the layers produced with the formulations may result when the oligomer contains carbon. Corresponding carbon-containing hydridosilane oligomers can be prepared by co-oligomerization of hydridosilanes with hydrocarbons. Preferably, however, the hydridosilane oligomer is a compound containing exclusively hydrogen and silicon, and which thus does not have any halogen or alkyl residues.

For preparation of doped silicon-containing layers, preference is further given to doped hydridosilane oligomers. The hydridosilane oligomers are preferably boron- or phosphorus-doped, and corresponding formulations are suitable for production of p- or n-doped silicon layers. Corresponding hydridosilane oligomers can be produced by adding the appropriate dopants at the early stage of the production thereof. Alternatively, it is also possible to p-dope undoped hydridosilane oligomers which have already been prepared with substances selected from the group of the p-dopants, especially the hydroboration reagents (especially $B_2H_6$, $BH_3$*THF, $BEt_3$, $BMe_3$), or to n-dope them with n-dopants (especially $PH_3$, $P_4$), by means of a high-energy process (for example UV irradiation or thermal treatment).

The proportion of the hydridosilane(s) is preferably 0.1 to 99% by weight, further preferably 1 to 40% by weight, most preferably 1 to 30% by weight, based on the total mass of the formulation.

The proportion of the hydridosilane oligomer(s) is preferably 0.1 to 99% by weight, more preferably 1 to 60% by weight, most preferably 10 to 40% by weight, based on the total mass of the formulation.

The proportion of the hydridosilane oligomer in the formulation, in addition, to achieve particularly good results, is preferably 40-99.9% by weight, more preferably 60-99% by weight, preferably 60-80% by weight, based on the total mass of hydridosilane and hydridosilane oligomer present. Even more preferably, the proportion of the hydridosilane oligomer is 60 to less than 70% by weight, based on the total mass of hydridosilane and hydridosilane oligomer present. Likewise more preferably, the proportion of the hydridosilane oligomer is 70-80% by weight, based on the total mass of hydridosilane and hydridosilane oligomer present.

Below 60% by weight, inhomogeneous, rough layers may result. In addition, corresponding formulations may lead to problems, since they can be too thin and exhibit wetting problems in the coating operation. This can often be remedied by varying the solvent content and the solvent composition, but this is costly and inconvenient.

Above 80% by weight, inhomogeneous, incomplete or lumpy layers may result, and the film may break in the coating process. In addition, defects may result in the layers ("comets").

Thus, an optimal proportion of hydridosilane oligomer in the formulation is 60-80% by weight, based on the total mass of hydridosilane and hydridosilane oligomer present.

The inventive formulation need not contain any solvent. However, it is preferably includes at least one solvent. If it contains a solvent, the proportion thereof is preferably 0.1 to 99% by weight, more preferably 25 to 95% by weight, most preferably 60 to 95% by weight, based on the total mass of the formulation.

Very particular preference is given to a formulation having 1-30% by weight of hydridosilane, 10-40% by weight of hydridosilane oligomer and 50-85% by weight of solvent, based on the total mass of the formulation with which the best results can be achieved.

Solvents usable with preference are those selected from the group consisting of linear, branched and cyclic, saturated, unsaturated and aromatic hydrocarbons having 1 to 12 carbon atoms (optionally partly or fully halogenated), alcohols, ethers, carboxylic acids, esters, nitriles, amines, amides, sulphoxides and water. Particular preference is given to n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform.

The inventive formulation may further comprise, as well as the at least one hydridosilane and the at least one hydridosilane oligomer and any solvent(s) present, further substances, especially dopants (preferably $B_2H_6$, $BH_3$*THF, $BEt_3$, $BMe_3$, $PH_3$, $P_4$), nanoparticles or additives for adjusting the rheological properties. Corresponding substances are known to those skilled in the art.

The present invention further provides a process for producing an inventive formulation, in which a hydridosilane of the generic formula $Si_nH_{2n+2}$ with n=7-10 is mixed with a hydridosilane oligomer and optionally a solvent.

The present invention further provides a process for producing silicon-containing layers, in which the inventive formulation, especially the coating composition, is applied from the gas phase or the liquid phase to an uncoated or precoated substrate, and converted to a silicon-containing layer thermally and/or with electromagnetic radiation.

It is possible to use a multitude of substrates for the process according to the invention. Preference is given to substrates consisting of glass, quartz glass, graphite, metal, silicon, or consisting of a layer of silicon, indium tin oxide, ZnO:F, ZnO:Al or $SnO_2$:F present on a heat-stable support. Preferred metals are aluminium, stainless steel, Cr steel, titanium, chromium or molybdenum. In addition, given selection of suitable conversion conditions, it is also possible to use polymer films (for example of PEEK, PEN, PET or polyimides).

The formulation is preferably applied via a gas or liquid phase coating process selected from printing processes (especially flexographic/gravure printing, nano- or microimprinting, inkjet printing, offset printing, reverse offset printing, digital offset printing and screen printing), spraying processes, aerosol assisted chemical vapour deposition, direct liquid injection chemical vapour deposition, spin-coating methods, dip-coating methods, and methods selected from meniscus coating, slit coating, slot-die coating and curtain coating. Of the aforementioned methods, aerosol assisted chemical vapour deposition and direct liquid injection chemical vapour deposition should be included among the gas phase processes. Preference is given to application via a liquid phase coating process.

After the application of the formulation, a precrosslinking operation can preferably be conducted via a UV irradiation of the liquid film on the substrate, after which the still-liquid film has crosslinked precursor fractions.

After application and any precrosslinking of the formulation, the coated substrate may also preferably be dried prior to conversion, in order to remove any solvent present. Corresponding measures and conditions for this purpose are known to those skilled in the art. In order to remove exclusively volatile formulation constituents, in the case of a thermal drying operation, the heating temperature should be less than 200° C.

The thermal conversion in the process according to the invention is effected preferably at temperatures of 200-1000° C., preferably 250-750° C., especially preferably 300-700° C. Thermal conversion times are preferably between 0.1 ms and 360 min. The conversion time is more preferably between 0.1 ms and 10 min, especially preferably between 1 s and 120 s.

Corresponding rapid high-energy processes can be effected, for example, by the use of an IR lamp, a hotplate, an oven, a flash lamp, a plasma of suitable gas composition, an RTP system, a microwave system or an electron beam treatment (if required, in the respective preheated or warmed state).

Alternatively or additionally, conversion can be effected by irradiation with electromagnetic radiation, especially with UV light. The conversion time may preferably be between 1 s and 360 min.

During or after the conversion, it is also possible with preference to conduct an enrichment of the silicon-containing layers with hydrogen. This is called a "hydrogen passivation", which eliminates defects in the material, and can be effected, for example, with reactive hydrogen by the hotwire method, with a hydrogen-containing plasma (remotely or directly; under reduced pressure or under atmospheric pressure) or by means of corona treatment or an electron beam treatment with supply of hydrogen. In addition, it is also possible to conduct the drying and/or conversion step already mentioned in a hydrogen-enriched atmosphere, such that the material is hydrogen-rich from the outset.

For production of silicon oxide-containing layers, it is also possible to conduct application, precrosslinking, drying and/or conversion under oxidizing conditions. The way in which oxidizing conditions are established is known to those skilled in the art.

For production of fully or partly crystalline silicon-containing layers, the layer can be crystallized after conversion by means of introduction of thermal energy, electromagnetic radiation and/or particle bombardment. Methods for this purpose are known to those skilled in the art.

The process described for production of silicon-containing layers can also be conducted simultaneously or more than once in succession with respect to a substrate (simultaneous or successive deposition, in which case the resulting films are partly or completely superposed on one another). Such a process for producing multilayer systems is preferentially suitable for production of systems formed from intrinsic (i.e. undoped) and doped layers, which are essential, for example, for the construction of solar cells. The process is more preferably suitable for production of multilayer systems for optimal passivation or avoidance of defects at the interface to the substrate, when a thin intrinsic (i.e. undoped) silicon-containing layer and then a layer having the opposite doping from the substrate are applied to the substrate. In this case, first an essentially dopant-free formulation and then a formulation having the opposite doping in relation to the substrate are therefore applied to a doped substrate. In addition, the substrate may be coated on both sides.

The hydridosilane formulations producible in accordance with the invention are suitable for a multitude of uses. They are of particularly good suitability—alone or together with other formulations—for production of electronic or optoelectronic component layers. The invention therefore also provides for the use of the inventive hydridosilane formulations for production of optoelectronic or electronic component layers. The present invention further provides for the use of the inventive hydridosilane formulations for production of electronic and optoelectronic components. The hydridosilane formulations obtainable by the process according to the invention are preferentially suitable for production of charge-transporting components in optoelectronic or electronic components. The hydridosilane formulations obtainable by the process according to the invention are further suitable for production of silicon-containing layers.

More particularly, the inventive formulations and the process of the invention are suitable for production of the following layers or components:
  heteroemitter solar cells
  HIT (heterojunction with intrinsic thin layer) solar cells
  selective emitter solar cells
  back contact solar cells
  field-effect transistors, thin-film transistors
  dielectric layers in microelectronic components surface passivation of semiconductor materials
  production of components and layers containing quantum dots
  barriers against diffusion of constituents from the environment through layers,
  barrier layers for thermal decoupling of the upper and lower sides of layers.

EXAMPLES

Example 1

A mixture of 0.21 g of nonasilane, 0.29 g of hydridosilane oligomer (corresponding to 58% by weight, based on the total mass of hydridosilane and hydridosilane oligomer) formed from neopentasilane (Mw~2200 g/mol), 0.37 g of cyclooctane and 0.87 g of toluene is coated onto EagleXG glass at 3000 rpm, 6000 rpm and 9000 rpm, and then converted at 500° C./60 s. The resulting layer thicknesses are between 48-74 nm.

The suitability in principle of the relatively thin coating formulation for semiconductor applications is apparent from FIG. 1. However, it can be inferred from the photographs and microscope images shown therein that the resulting coatings are relatively inhomogeneous and rough.

Example 2

A mixture of 0.25 g of undoped hydridosilane oligomer (corresponding to 62.5% by weight, based on the total mass of hydridosilane and hydridosilane oligomer) formed from neopentasilane ($M_w$~2300 g) and 0.150 g of nonasilane in 0.180 g of cyclooctane in 0.420 g of toluene was coated onto EagleXG glass at 6000 rpm, and then converted at 500° C./60 s. The resulting layer thickness is 113 nm.

The resulting layers are homogeneous and smooth.

Example 3

A mixture of 0.17 g of nonasilane, 0.33 g of hydridosilane oligomer (corresponding to 66% by weight, based on the total mass of hydridosilane and hydridosilane oligomer) formed from neopentasilane ($M_w$~2200 g/mol), 0.87 g of toluene and 0.37 g of cyclooctane is coated onto EagleXG glass at 3000 rpm, 6000 rpm and 9000 rpm, and then converted at 500° C./60 s. The resulting layer thicknesses are in the range between 66-104 nm.

Figure 2:
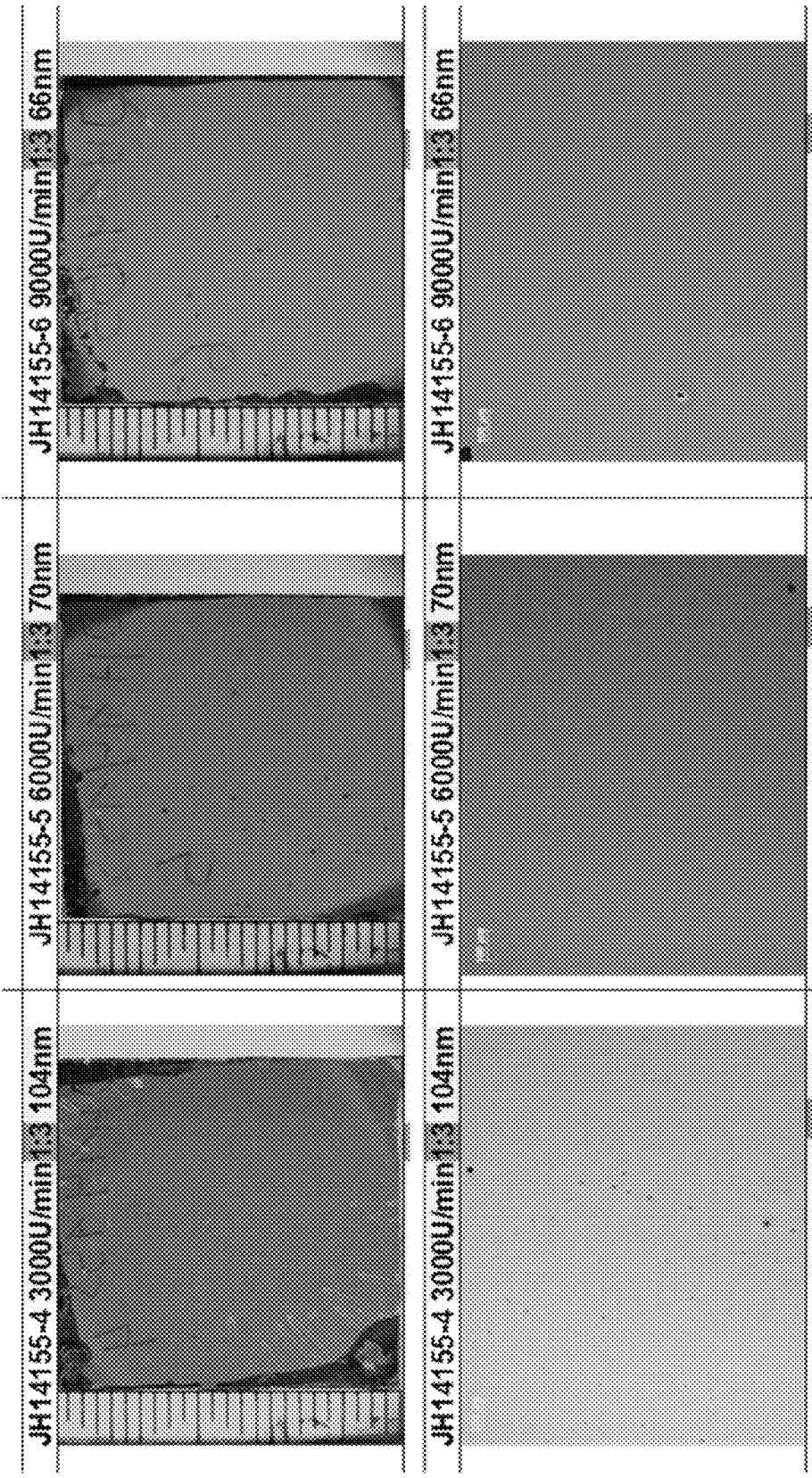
FIG. 2 are photographs and microscope images of a coating formed in Example 3.

The resulting layers are homogeneous and smooth, as is also apparent from the photographs and microscope images according to FIG. 2.

Example 4

A mixture of 0.13 g of nonasilane, 0.37 g of hydridosilane oligomer (corresponding to 74% by weight, based on the total mass of hydridosilane and hydridosilane oligomer) formed from neopentasilane ($M_w$~2200 g/mol), 0.87 g of toluene and 0.37 g of cyclooctane is coated onto EagleXG glass at 3000 rpm, 6000 rpm and 9000 rpm, and then converted at 500° C./60 s. The resulting layer thicknesses are in the range between 90-140 nm.

Figure 3:
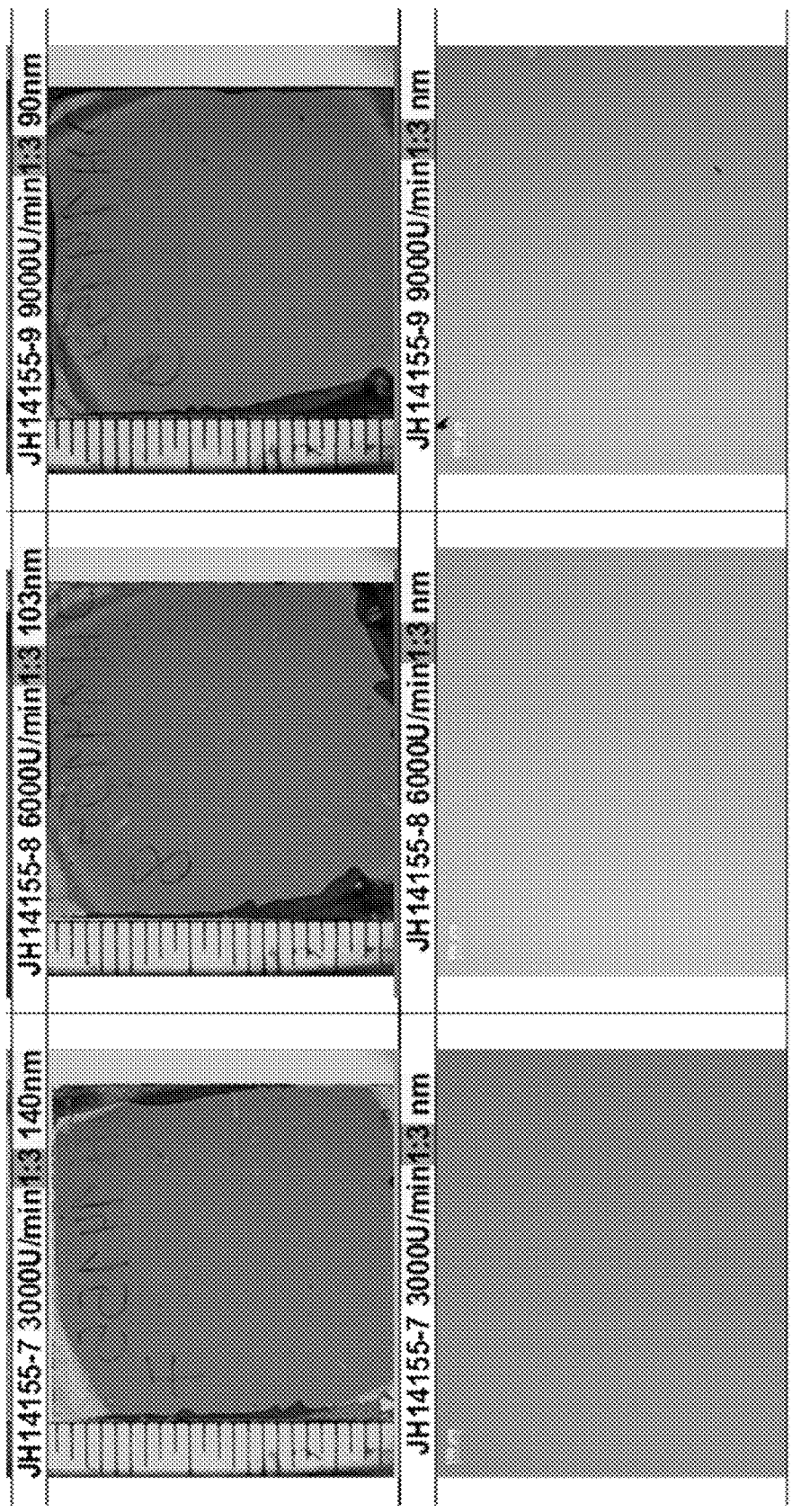
FIG. 3 are photographs and microscope images of a coating formed in Example 4.

The resulting layers are homogeneous and smooth, as is also apparent from the photographs and microscope images according to FIG. 3.

Example 5

A mixture of 0.25 g of undoped hydridosilane oligomer (corresponding to 76.9% by weight, based on the total mass of hydridosilane and hydridosilane oligomer) formed from neopentasilane ($M_w$~2300 g) and 0.075 g of nonasilane in 0.158 g of cyclooctane in 0.368 g of toluene was coated onto EagleXG glass at 6000 rpm, and then converted at 500° C./60 s. The resulting layer thickness is 130 nm.

The resulting layers are homogeneous and smooth.

Example 6

A mixture of 0.08 g of nonasilane, 0.42 g of hydridosilane oligomer (84% by weight, based on the total mass of hydridosilane and hydridosilane oligomer) formed from neopentasilane ($M_w$~2000 g/mol), 0.24 g of cyclooctane and 0.96 g of toluene is coated onto EagleXG glass at 4500 rpm and 6000 rpm, and then converted at 500° C./60 s. The resulting layer thicknesses are 164 nm and 150 nm respectively.

Figure 4:
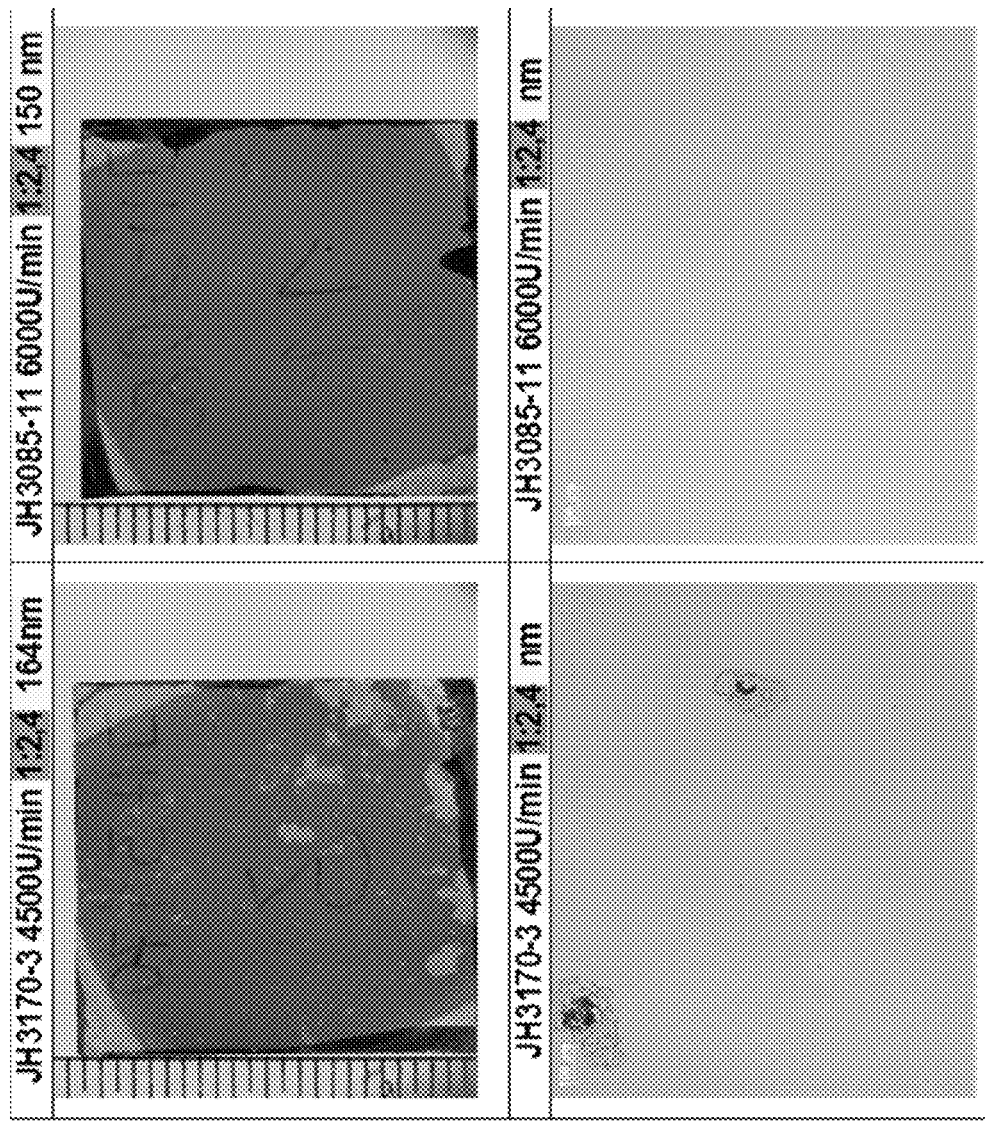
FIG. 4 are photographs and microscope images of a coating formed in Example 6.

The suitability in principle of the relatively thin coating formulation for semiconductor applications is apparent from FIG. 4. However, it can be inferred from the photographs and microscope images shown therein that the resulting coatings are relatively inhomogeneous, incomplete and rough. In addition, defects are apparent in the layer.

Comparative Example 1

A mixture of 0.25 g of undoped hydridosilane oligomer formed from neopentasilane ($M_w$~2300 g) in 0.203 g of cyclooctane in 0.472 g of toluene was coated onto EagleXG glass at 6000 rpm, and then converted at 500° C./60 s. The resulting layer thickness is 102 nm. However, the resulting layers are disadvantageous.

Comparative Example 2

A mixture of 0.25 g of undoped hydridosilane oligomer formed from neopentasilane ($M_w$~2300 g) and 0.150 g of neopentasilane in 0.180 g of cyclooctane in 0.420 g of toluene was coated onto EagleXG glass at 6000 rpm, and then converted at 500° C./60 s. The resulting layer thickness is 99 nm. The yield is thus less favourable than when a hydridosilane of the generic formula $Si_nH_{2n+2}$ with n=7-10 is added.

Comparative Example 3

A mixture of 0.27 g of nonasilane, 0.03 g of hydridosilane oligomer (10% by weight, based on the total mass of hydridosilane and hydridosilane oligomer) formed from neopentasilane ($M_w$~2200 g/mol) and 0.30 g of toluene is coated onto EagleXG glass at 1000 rpm, 2000 rpm, 3000 rpm and 6000 rpm, and then converted at 500° C./60 s. The resulting layers are inhomogeneous and incomplete, and have many defects.

Comparative Example 4

A mixture of 0.27 g of nonasilane, 0.03 g of hydridosilane oligomer (10% by weight, based on the total mass of hydridosilane and hydridosilane oligomer) formed from neopentasilane ($M_w$~2200 g/mol), 0.48 g of toluene and 0.20 g of cyclooctane is coated onto EagleXG glass at 1000 rpm, 2000 rpm, 3000 rpm and 6000 rpm, and then converted at 500° C./60 s. The resulting layers are inhomogeneous and incomplete, and have many defects.

The invention claimed is:

1. A formulation, comprising:
   at least one hydridosilane, and
   at least one hydridosilane oligomer, wherein the at least one hydridosilane has a generic formula $Si_nH_{2n+2}$ with n ranging from 7-10,
   wherein a proportion of the at least one hydridosilane is 0.1 to 60% by weight and a proportion of the at least one hydridosilane oligomer is from 40 to 99.9% by weight, each based on the total mass of said at least one hydridosilane and said at least one hydridosilane oligomer,
   wherein the at least one hydridosilane oligomer has a weight-average molecular weight of 200 g/mol to 10 000 g/mol.

2. The formulation according to claim 1, wherein the at least one hydridosilane is an octasilane isomer or a nonasilane isomer.

3. The formulation according to claim 1, wherein the at least one hydridosilane is a branched hydridosilane.

4. The formulation according to claim 1, wherein the at least one hydridosilane oligomer is obtained by a process comprising oligomerizing noncyclic hydridosilanes.

5. The formulation according to claim 4, wherein the at least one hydridosilane oligomer is obtained by a process comprising converting thermally a composition comprising a noncyclic hydridosilane comprising not more than 20 silicon atoms, in the absence of a catalyst at a temperature of less than 235° C.

6. The formulation according to claim 1, wherein the at least one hydridosilane oligomer comprises carbon.

7. The formulation according to claim 1, wherein the at least one hydridosilane oligomer is doped.

8. The formulation according to claim 1, wherein a proportion of the at least one hydridosilane is in a range of 1% to 40% by weight based on the total mass of the formulation.

9. The formulation according to claim 1, wherein a proportion of the at least one hydridosilane oligomer is in a range of 1% to 60% by weight based on the total mass of the formulation.

10. The formulation according to claim 1, wherein the formulation comprises a solvent.

11. The formulation according to claim 10, wherein a proportion of the solvent is in a range of 25% to 95% by weight based on the total mass of the formulation.

12. The formulation according to claim 10, wherein the formulation comprises: 1-30% by weight of at least one hydridosilane, 10-40% by weight of at least one hydridosilane oligomer and 50-85% by weight of solvent, based on the total mass of the formulation.

13. A process for preparing a formulation according to claim 1, the process comprising:
   mixing the at least one hydridosilane with the at least one hydridosilane oligomer and optionally a solvent.

14. A method for producing layers comprising silicon, the method comprising:
   applying the formulation according to claim 1 to a substrate.

15. A method for producing electronic or optoelectronic layers, the method comprising:
   applying the formulation according to claim 1 to a substrate.

16. A method for producing electronic or optoelectronic components, the method comprising:
   applying the formulation according to claim 1 to a substrate.

17. The formulation according to claim 1, further comprising a solvent in an amount of 0.1 to 99 wt. %, based on a total mass of said formulation.

18. The formulation according to claim 1, further comprising a solvent in an amount of 25 to 99 wt. %, based on a total mass of said formulation.

19. The formulation according to claim 1, further comprising a solvent in an amount of 60 to 95 wt. %, based on a total mass of said formulation.

\* \* \* \* \*